(12) United States Patent
Johnston

(10) Patent No.: US 8,862,968 B1
(45) Date of Patent: Oct. 14, 2014

(54) CIRCUIT FOR FORWARD ERROR CORRECTION ENCODING OF DATA BLOCKS

(75) Inventor: Graham Johnston, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 161 days.

(21) Appl. No.: 13/287,918

(22) Filed: Nov. 2, 2011

(51) Int. Cl.
*H03M 13/00* (2006.01)

(52) U.S. Cl.
USPC .............................. 714/781; 714/782; 714/784

(58) Field of Classification Search
None
See application file for complete search history.

(56) References Cited

U.S. PATENT DOCUMENTS

| | | | | |
|---|---|---|---|---|
| 5,754,563 | A * | 5/1998 | White | 714/757 |
| 5,875,200 | A * | 2/1999 | Glover et al. | 714/784 |
| 6,836,869 | B1 * | 12/2004 | Wyland | 714/781 |
| 7,124,064 | B1 * | 10/2006 | Thurston | 703/2 |
| 7,243,292 | B1 * | 7/2007 | Naslund et al. | 714/781 |
| 7,509,564 | B2 * | 3/2009 | Dohmen et al. | 714/782 |
| 2007/0266291 | A1 * | 11/2007 | Toda et al. | 714/746 |
| 2008/0140740 | A1 * | 6/2008 | Williamson et al. | 708/200 |
| 2009/0150754 | A1 * | 6/2009 | Dohmen et al. | 714/785 |

OTHER PUBLICATIONS

BBC, Research & Development White Paper, WHP 031, Reed-Solomon error correction, C.K.P. Clarke, British Broadcasting Corporation, Jul. 2002, 48 pages.

Paar, Christof, "Optimized Arithmetic for Reed-Solomon Encoders", ECE Department, 1997 IEEE International Symposium on Information Theory, Jun. 29-Jul. 4, 1997, pp. 1-7, Ulm, Germany.

Xilinx, Inc., LogiCORE IP, Reed-Solomon Encoder v7.1, Datasheet DS251, Product Specification, Mar. 1, 2011, pp. 1-16, Xilinx, Inc., 2100 Logic Drive, San Jose, CA USA.

* cited by examiner

*Primary Examiner* — Albert Decady
*Assistant Examiner* — Enamul M Kabir
(74) *Attorney, Agent, or Firm* — LeRoy D. Maunu

(57) ABSTRACT

In one embodiment, an encoder circuit is provided. The encoder includes an input circuit having a plurality of finite field subtraction circuits, each configured to receive a respective one of the sequence of symbols and subtract the symbol from a respective symbol of an intermediate polynomial to produce a respective feedback symbol. For each coefficient of a code generation polynomial, a first circuit is configured to multiply each feedback symbol by a respective constant corresponding to the coefficient to produce a first set of intermediate results. Each first set of intermediate results is summed to produce a second intermediate result. A buffer circuit of the encoder is configured and arranged to store the second intermediate results produced by the first circuit as the intermediate polynomial.

20 Claims, 5 Drawing Sheets

CIRCUIT FOR FORWARD ERROR CORRECTION ENCODING OF DATA BLOCKS

FIELD OF THE INVENTION

One or more embodiments generally relate to encoding data blocks.

BACKGROUND

In design of communications systems, there is generally a compromise between bit error rate (BER) and transmission bit rate. Higher bit rates tend to have higher BERs. A well-known limit on capacity of a communications channel is the Shannon Limit. In practice, where forward error correction (FEC) is used, the Shannon Limit is a theoretical boundary on channel capacity for a given modulation and code rate, where the code rate is the ratio of data bits to total bits transmitted per unit time. FEC coding adds redundancy to a message by encoding such a message prior to transmission. Some example error correction codes include Hamming, Bose-Chaudhuri-Hochquenghem (BCH), Reed-Solomon (RS), Viterbi, trellis, etc.

Several of these codes have been standardized in the International Telecommunication Union Telecommunication Standardization Sector (ITU-T) G.975 and G.709. For example, the standardized Reed-Solomon (255, 239) code has a net coding gain (NCG) of 6.2 dB at a 10-15 decoder output bit error rate (BER) with a 6.69% redundancy ratio. However, for high-speed (10 Gb/s and beyond) communication systems, more powerful forward error correction (FEC) codes have become necessary in order to achieve greater correction capability to compensate for serious transmission quality degradation.

More recently, Super-FEC coding schemes have been developed that utilize a combination of two or more encoding schemes to provide greater BER correction capability and increase throughput. Generally, RS encoding is combined with another encoding. For example, ITU-T G.975.1 I.4 specifies a concatenation of RS and BCH encoding schemes. Due to its high performance, RS encoding is expected to remain in widespread use for FEC encoding and a variety of Super-FEC coding schemes.

Reed-Solomon codes are systematic block codes used for error correction. Input data is partitioned into data blocks containing K symbols. Each block of K input symbols is used to generate R check/parity symbols. The combination of K input symbols and R check/parity symbols are concatenated to form an L symbol codeword that may be used to detect and correct corruption of the codeword.

The R check/parity symbols correspond to the remainder polynomial from finite field polynomial division, where the dividend polynomial is given by the block of K input symbols and the divisor polynomial is a code generator polynomial, G(t), given by the particular Reed-Solomon code that is being used. The code generator polynomial of order R, takes the form:

$$G(y)=y^R+C_{R-1}*y^{R-1}+C_2*y^2+C_1*y+C_0, C_r=1.$$

The generator polynomial is an irreducible polynomial having a number of coefficients (M), which is equal to the number of check/parity symbols in each code block.

Evaluating the remainder polynomial from finite field polynomial division is a complex operation requiring significant resources such as circuit area and computation time. In an application that continuously generates Reed-Solomon-encoded data, the evaluation of the remainder polynomial needs to achieve a throughput rate that equals or exceeds the data rate of the vectors of input symbols.

A standard Reed-Solomon encoder evaluates the remainder polynomial in a recursive process requiring K iterations. Each iteration requires multiple, simultaneous, finite field multiplications and additions/subtractions. To calculate the modulus of the division, an incomplete remainder is maintained throughout the calculation. In each iteration t (0<t<=K), the remainder X(t) is calculated by subtracting a new data symbol, D(t), from the most significant symbol $(X_{R-1})$ of the previously calculated remainder X(t−1), and the result is multiplied by the generator polynomial G(y) and subtracted from X(t−1):

$$X(t)=X(t-1)-G(y)*(Sig(X_{R-1}(t-1)-D(t))$$

For high-speed communication applications, parallel processing may be needed to meet throughput requirements. One approach to parallelize Reed-Solomon encoding implements multiple instances of the standard encoder, and each instance decodes a separate data block or data channel. Another approach modifies the standard Reed-Solomon encoder to process multiple data blocks of multiple data channels in a time-division-multiplexed (TDM) fashion. Neither of these approaches is desirable because the former solution increases hardware requirements linearly as the number of channels increases, and the latter solution increases latency of the encoding.

One or more embodiments may address one or more of the above issues.

SUMMARY

In one embodiment, an encoder is provided for encoding a sequence of symbols. The encoder includes an input circuit having a plurality of finite field subtraction circuits, each being configured to receive a respective one of the sequence of symbols and subtract the one symbol from a respective symbol of an intermediate polynomial over a finite field to produce a respective feedback symbol. The encoder also includes a first circuit configured and arranged to, for each coefficient of a code generation polynomial, to multiply each of the feedback symbols over the finite field by a respective constant corresponding to the coefficient to produce a first set of intermediate results, and add the first set of intermediate results over the finite field to produce a second intermediate result. An encoder includes a buffer circuit having inputs coupled to the first circuit and outputs coupled to inputs of the plurality of finite field subtraction circuits. The buffer circuit is configured and arranged to store the second intermediate results produced by the first circuit as the intermediate polynomial.

In another embodiment, a parallel encoding circuit is provided. The parallel encoding circuit includes an input circuit having N finite field subtraction circuits, each configured and arranged to receive a respective symbol of a data block and subtract the respective symbol of the data block from a respective symbol of an intermediate polynomial to produce a respective feedback symbol. A circuit of the encoder includes, for each coefficient of a code generation polynomial having N coefficients, N finite field multipliers coupled to the input circuit, each configured to multiply a respective one of the feedback symbols by a respective constant corresponding to the coefficient. The circuit also includes, for each coefficient, a finite field adder coupled to the N finite field multipliers, the adder being configured to add the output of the N finite field multipliers to produce an intermediate result. The encoder further includes a plurality of shift registers. Each shift register has an input coupled to an output of a respective one of the finite field adders of the multiplication circuit, and an output coupled to an input of a respective one of the N finite field subtraction circuits of the input circuit. The shift registers are configured to store data symbols of the intermediate polynomial.

In yet another embodiment, a method is provided for generating an HDL circuit design specification of an encoder circuit. Using a processor, a code generation polynomial having M coefficients ($0<=i<M$) is input, and an HDL circuit design specification of an encoder circuit is generated for the code generation polynomial. The encoder circuit includes an input circuit, a first circuit and a buffer circuit. The generated HDL circuit design specification is stored in a computer readable medium. The input circuit includes N finite field subtraction circuits, each configured to receive a respective one of the K symbols and subtract the one symbol from a respective symbol of an intermediate polynomial over a finite field to produce a respective feedback symbol. The first circuit is configured, for each coefficient ($C_i$) of the M coefficients, to multiply each of the feedback symbols over the finite field by a respective constant corresponding to the coefficient to produce a first set of intermediate results. The first circuit is also configured for each $C_i$ to add the first set of intermediate results over the finite field to produce a respective second intermediate result. The buffer circuit includes inputs coupled to the first circuit and outputs coupled to inputs of the N finite field subtraction circuits. The buffer circuit is configured to store the second intermediate results produced by the first circuit as the intermediate polynomial.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
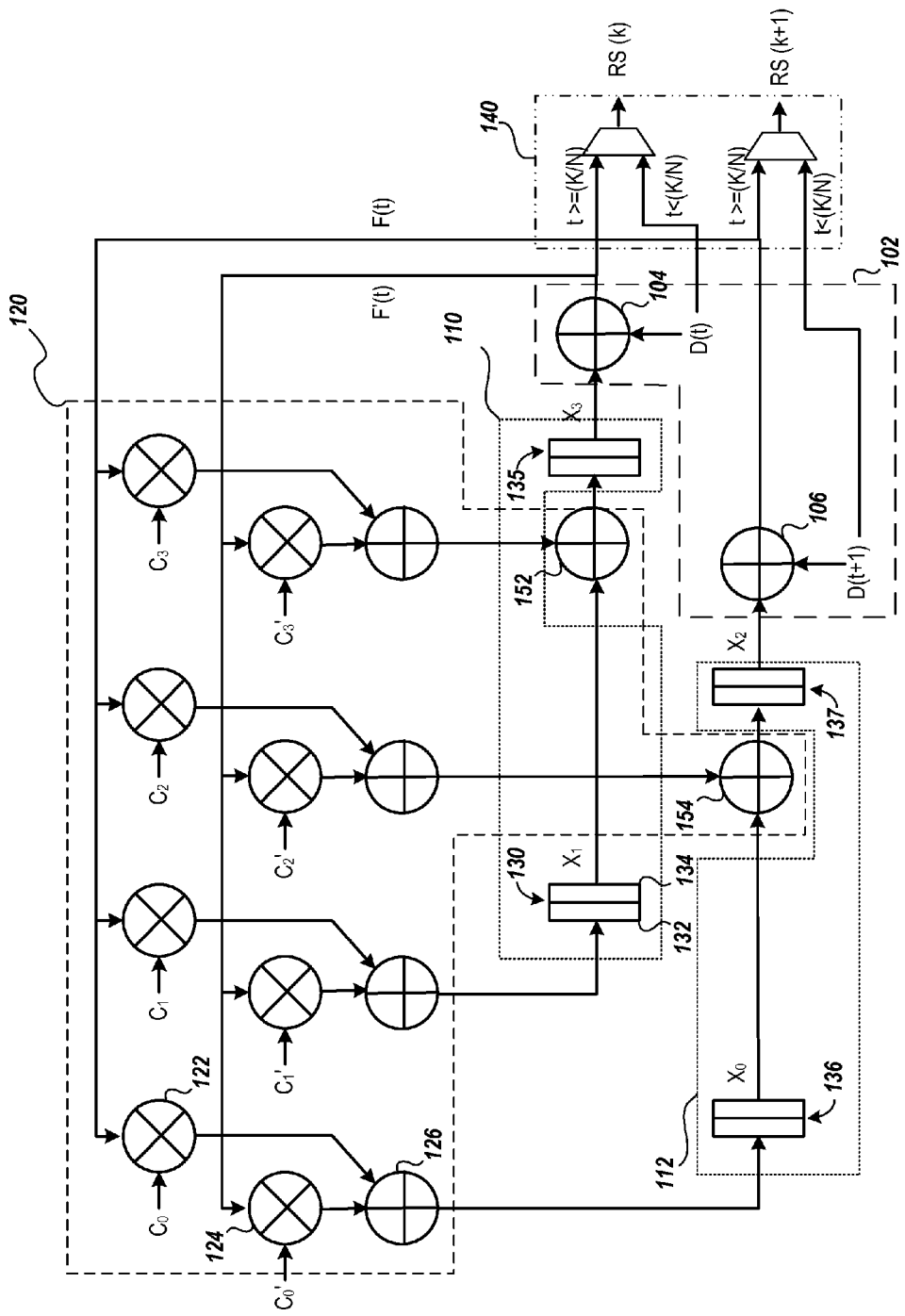
FIG. 1 shows a partially parallel encoder in accordance with one or more embodiments.

One or more embodiments provide a circuit and method for Reed-Solomon encoding, in which the feedback arithmetic of the recursive finite field division is altered so that multiple input symbols of a code block are processed simultaneously. The resulting design uses less hardware than would be required to implement multiple instances of the standard encoder while achieving the same level of throughput.

The encoding process may be understood with reference to a matrix description of the recursive finite field division. For example, each iteration $$X(t+1) = X(t) - g(y)*(X_{R-1}(t) - D(t))$$

of the standard Reed-Solomon encoding process discussed above, can be represented as a matrix multiplication:

$$X(t+1) = \begin{bmatrix} C_{R-1} & I & 0 & \ldots & 0 \\ C_{R-2} & 0 & I & \ldots & 0 \\ \vdots & \vdots & \vdots & \ddots & \vdots \\ C_1 & 0 & 0 & \ldots & I \\ C_0 & 0 & 0 & \ldots & 0 \end{bmatrix} * \begin{bmatrix} X_{R-1}(t) + D(t) \\ X_{R-2}(t) \\ \vdots \\ X_1(t) \\ X_0(t) \end{bmatrix}$$

where $X(t+1)$ is the resulting value of the partial remainder following iteration t. For ease of reference, the partial remainder updated in each iteration may be referred to as an intermediate polynomial and such terms may be used interchangeably herein. The first matrix in the above calculation is an $R \times R$ matrix of $M \times M$ matrices. Each coefficient $C_N$ in the first matrix represents an $M \times M$ matrix of XOR operations in the finite field multiplication, and each matrix I in the first matrix represents an $M \times M$ identity matrix of XOR operations. The second matrix is an $R \times 1$ matrix of matrices. $D(t)$ is the current M-bit input data symbol, and $X_N(t)$ is the M-bit symbol, which represents one of the R data symbols of the partial remainder $X(t)$ stored in the registers in the feedback loop.

One or more embodiments expand the above matrix calculation to calculate $X(t+2)$ (i.e., the value of the partial remainder after 2 cycles of processing) in a single clock cycle. A detailed treatment of part of this calculation is shown for an arbitrary sized Reed-Solomon code, with output block size L, input block size K and a generator polynomial of order R, ($R=L-K$). Multiplying the first two rows of the above matrices gives:

$$X_{R-1}(t+1) = C_{R-1}(X_{R-1}(t) + D(t)) + X_{R-2}(t)$$

$$X_{R-2}(t+1) = C_{R-2}(X_{R-1}(t) + D(t)) + X_{R-3}(t)$$

Advancing by one clock cycle and multiplying gives:

$$X(t+2) = C_{R-1}(X_{R-1}(t+1) + D(t+1)) + X_{R-2}(t+1)$$

Substituting $X(t+1)$ gives:

$$X_{R-1}(t+1) = (C_{R-1}^2 + C_{R-2})*(X_{R-1}(t) + D(t)) + C_{R-1}(X_{R-2}(t) + D(t+1)) + X_{R-3}(t)$$

However, in Galois Field arithmetic, $C_{R-1}^2 + C_{R-2}$ is an m-bit constant, $C'_{R-1}$. Therefore, $$X_{R-1}(t+2) = C'_{R-1}(X_{R-1}(t) + D(t)) + C_{R-1}*(X_{R-2}(t) + D(t+1)) + X_{R-3}(t)$$

and the matrix multiplication becomes:

$$X(t+2) = \begin{bmatrix} C'_{R-1} & C_{R-1} & 1 & 0 & \ldots & 0 \\ C'_{R-2} & C_{R-2} & 0 & 1 & \ldots & 0 \\ \vdots & \vdots & \vdots & \vdots & \ddots & \vdots \\ C'_2 & C_2 & 0 & 0 & \ldots & 1 \\ C'_1 & C_1 & 0 & 0 & \ldots & 0 \\ C'_0 & C_0 & 0 & 0 & \ldots & 0 \end{bmatrix} * \begin{bmatrix} X_{R-1}(t) + D(t) \\ X_{R-2}(t) + D(t+1) \\ \vdots \\ X_2(t) \\ X_1(t) \\ X_0(t) \end{bmatrix}$$

Each of the above $X(t+1)$ and $X(t+2)$ calculations represents a large array of XOR operations performed in each iteration of the encoding process. In the $X(t+2)$ implementation, the XOR operations performed in two iterations of the standard $X(t+1)$ equation can be optimized to perform the calculation using fewer XOR operations. In this manner, hardware resources may be reduced.

FIG. 1 shows a partially parallelized Reed-Solomon encoder in accordance with one or more embodiments. The encoder includes an input circuit 102 configured to receive and process N data symbols of a data block in each iteration. For ease of illustration, the encoder is configured to receive and process two symbols of the data block D(t) and D(t+1) in parallel in each iteration and calculate the partial remainder X(t+2), as discussed above. The iterative process is repeated until all K symbols of the data block have been processed. However, the embodiments are not so limited. It is recognized that the encoder may be configured to process various numbers of data symbols (up to R data symbols) in parallel per iteration. Accordingly, the encoder shown in FIG. 1 is described generically using above-mentioned N, M, R, and K numerical variables to indicate numbers of elements in the circuitry.

The input circuit includes N=2 finite-field subtraction circuits (104 and 106), each configured to receive a respective one of N input data symbols and subtract the one received data symbol from a respective symbol (e.g. $X_2$ and $X_3$) of a partial remainder X(t) over a finite field to produce a respective feedback symbol (e.g. F(t) and F'(t)). The partial remainder X(t) is stored using N pipeline buffer circuits 110 and 112.

An XOR logic circuit 120 is configured to multiply the feedback symbols by respective coefficients of code generation polynomial G(y), and subtract the result from the previous partial remainder X(t) to determine the partial remainder for the next iteration X(t+1). For each coefficient ($C_i$) of a code generation polynomial (G(y)), having M coefficients (0<=i<M), the XOR logic circuit multiplies each of the feedback symbols over the finite field by a respective constant (e.g. $C_0$ and $C'_0$) corresponding to the coefficient $C_i$, using finite field multipliers (e.g. 122 and 124), to produce a first set of intermediate results. The first set of intermediate results are summed over the finite field using a finite field adder (e.g. 126) to produce a second intermediate result. The second intermediate results are subtracted from the buffered previous partial remainder X(t) to determine partial remainder X(t+1).

The partial remainder is buffered using M shift registers. An example one of the M shift registers is shown as shift register 130. Each shift register includes N individual registers, and each individual register is configured for storage of the bits of a partial remainder. Shift register 130 includes individual registers 132 and 134, for example. The individual registers of a shift register are coupled in a cascade chain such that the output of one individual register is coupled to the input of the next individual register in the chain. For example, the outputs of individual register 132 are coupled to the inputs of individual register 134. Each shift register (e.g., 130) includes a number of individual registers in the chain for buffering N symbol values (i.e., N-deep shift registers) of the partial remainder. In this example, the shift registers 130, 135, 136, and 137 (M=4) are organized into 2 pipelined buffers 110 and 112 (i.e., N=2). When M is evenly divisible by N, as illustrated here, the number of shift registers in each pipelined buffer is equal to M divided by N. However, when M is not evenly divisible by N, the first mod(M,N) pipeline buffers contain a number of shift registers equal to floor(M/N)+1. The remaining pipeline buffers contain a number of shift registers equal to floor(M/N).

Following calculation of the second intermediate results, values are right shifted in each of the pipelined buffers, and the second intermediate results are subtracted, over the finite field, by the logic circuit (using, e.g., 152 and 154) from the shifted values. In effect, each pipelined buffer J of the N pipeline buffers receives second intermediate results corresponding to a respective coefficient $c_J$. For example, pipelined buffer 112 (i.e., pipelined buffer J=0), is configured to receive second intermediate results produced by the adder 126 of corresponding coefficient $c_0$ and store the intermediate results in shift register 136.

For every $N^{th}$ coefficient following $C_J$, the logic circuit 120 is configured to subtract the coefficient from a symbol of the partial remainder shifted from the previous shift register. For example, for pipelined buffer 112 (i.e., pipelined buffer J=0), the logic circuit 120 includes finite field subtraction circuit 154 to subtract the second intermediate results corresponding to coefficient $C_2$ (i.e., $C_{0+2}$) from a symbol output from shift register 136 and input the result to shift register 137. As another example, for pipelined buffer 110 (i.e., pipelined buffer J=1), the logic circuit 120 includes finite field subtraction circuit 152 to subtract intermediate results corresponding to coefficient $C_3$ (i.e., $C_{1+2}$) from a symbol output from shift register 130 and input the result to shift register 135.

As described above, a Reed-Solomon encoder generates an output block of size L, which includes the K input data symbols and R (i.e., R=L−K) check/parity symbols. For K/N iterations, an output selection circuit 140 directly outputs the input data symbols. After all K symbols of the data block have been received, the output selection circuit outputs the partial remainders stored in the pipelined buffer circuits 110 and 112.

The encoder circuit shown in FIG. 1 illustrates the finite field addition, subtraction, and multiplication operations performed by the logic circuit 120 as being performed by separate circuits. However, because these operations are calculated over a finite field, these circuits may be implemented using XOR logic, which may be reduced or optimized to implement the logic circuit 120 using fewer XOR gates. For example, one or more embodiments optimize the logic circuit to minimize the number of XOR additions that are performed by the logic circuit. Optimization of XOR logic may be performed using any number of known optimization algorithms for XOR logic. This reduction of the XOR logic allows the Reed-Solomon encoder to perform parallel encoding operations with less hardware in comparison to the previous approaches discussed above.

Figure 2:
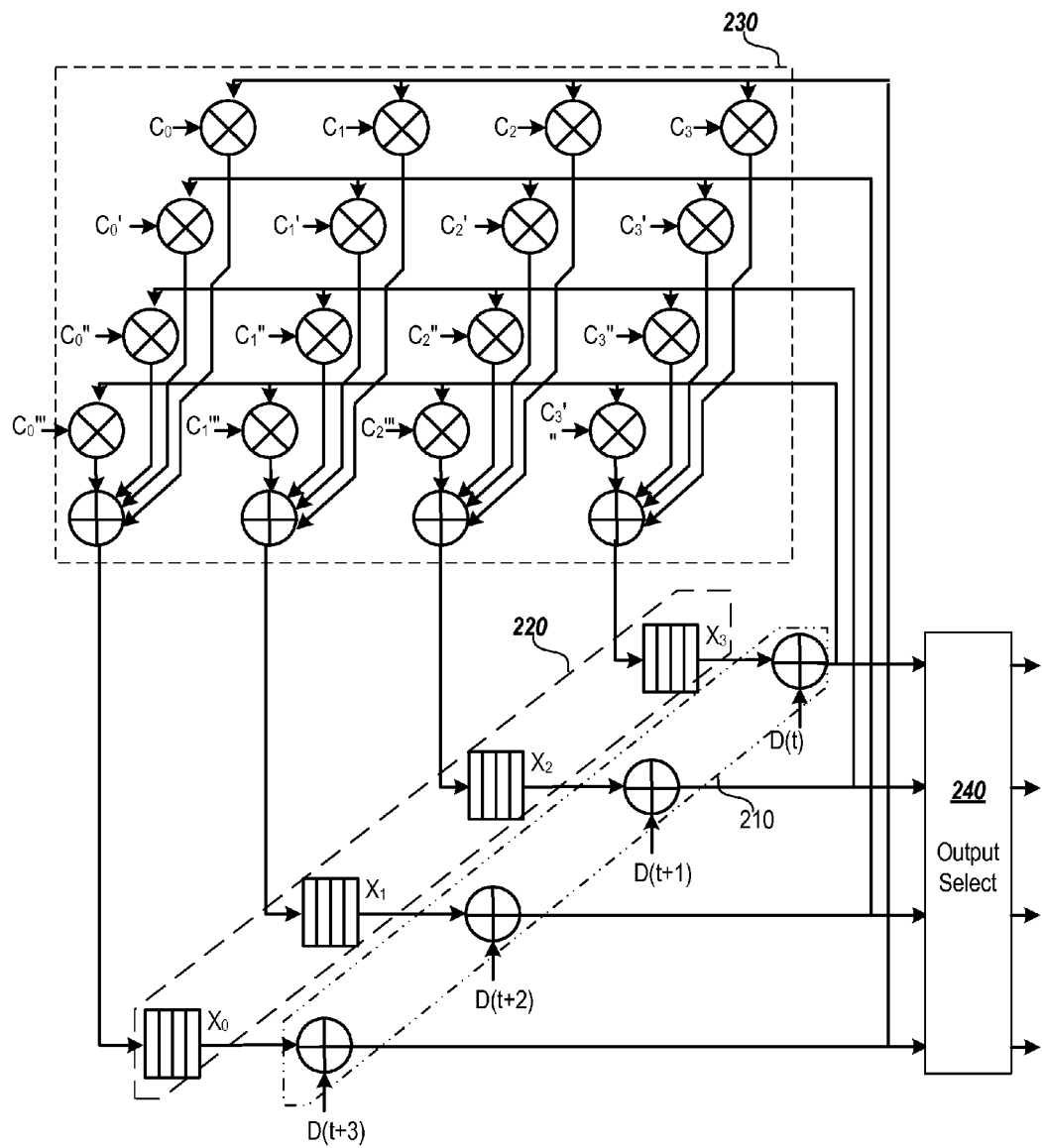
FIG. 2 shows a fully parallel Reed-Solomon encoder in accordance with one or more embodiments.

As described above, the encoder shown in FIG. 1 may be configured to process a desired number of data symbols (up to M data symbols) in parallel per iteration. FIG. 2 shows a fully parallel (i.e., N=M) implementation of the Reed-Solomon encoder shown in FIG. 1. Like FIG. 1, this example implements a code generation polynomial having M=4 coefficients. Similar to FIG. 1, the encoder includes an input circuit 210 configured to receive and process a plurality of data symbols (4 symbols in this example) of a data block per iteration. In this fully parallel implementation, the input circuit includes N=4 finite-field subtraction circuits, each configured to receive a respective data symbol and subtract the input data symbol from a partial remainder X(t) to produce a respective feedback symbol. The partial remainder is buffered in a set of M of shift registers 220.

As described above, an XOR logic circuit 230 is configured to multiply each of the feedback symbols by a respective set of constants C, C', C'', or C''' corresponding to coefficients of the code generation polynomial G(y). The results of the multiplication operations are summed for each coefficient to produce a symbol of the partial remainder, which is buffered in a respective shift register of buffer circuit 220. In this fully parallel version, hardware of the XOR logic circuit 230 may be implemented to provide an optimal solution in which encoding operations are performed using the amount of XOR resources.

As described with reference to FIG. 1, the fully parallel encoder shown in FIG. 2 includes an output selection circuit 240 that is configured to directly output the input data symbols, for K/N iterations. After K/N iterations, the parity symbols (i.e., the remainder polynomial) stored in the shift registers of buffer circuit 220 are selected as output symbols by output selection circuit 240 as the symbols are output from the shift registers.

Figure 3:
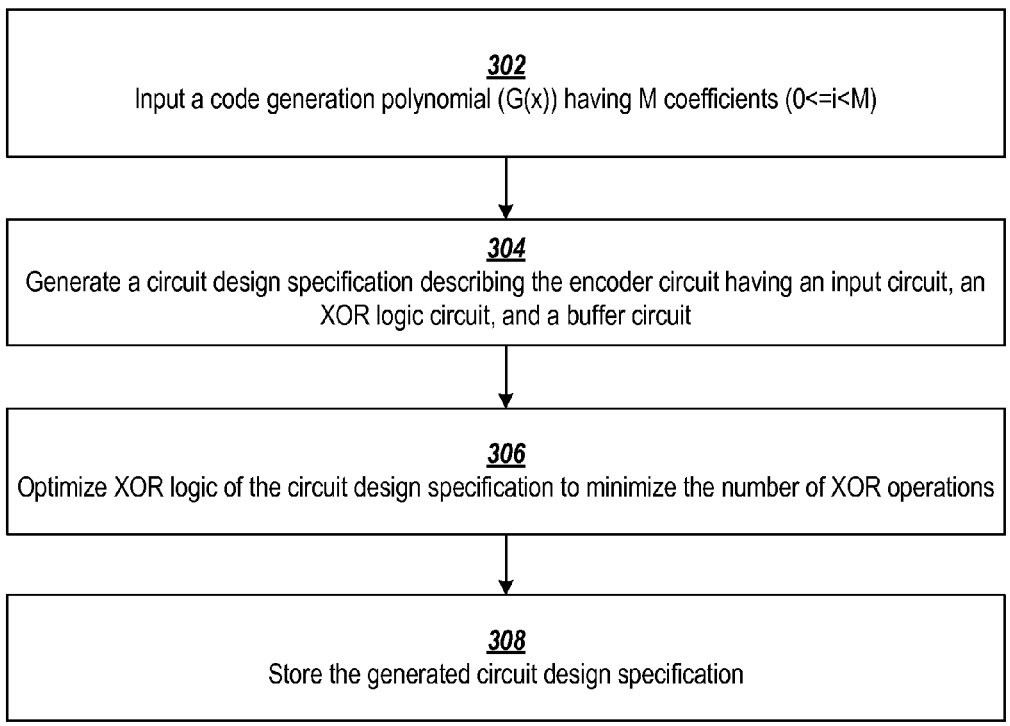
FIG. 3 shows a method of generating a circuit design specification of an encoder circuit in accordance with one or more embodiments.

FIG. 3 shows a method of generating a circuit design specification of an encoder circuit in accordance with one or more embodiments. A code generation polynomial having M coefficients is input by a designer at block 302. Along with the desired code generation polynomial, the designer may specify the value for a parameter N, which is the desired number of parallel circuit path in the design to be generated. The value of N may be from 2 to M. A circuit design specification is generated at block 304 describing the encoder circuit having an input circuit, an XOR logic circuit, and a buffer circuit as described with reference to FIG. 1 or 2 above. XOR logic of the XOR logic circuit is optimized at block 306 in the circuit design specification to minimize the number of XOR operations as described above. The resulting circuit design specification is stored at block 308.

Figure 4:
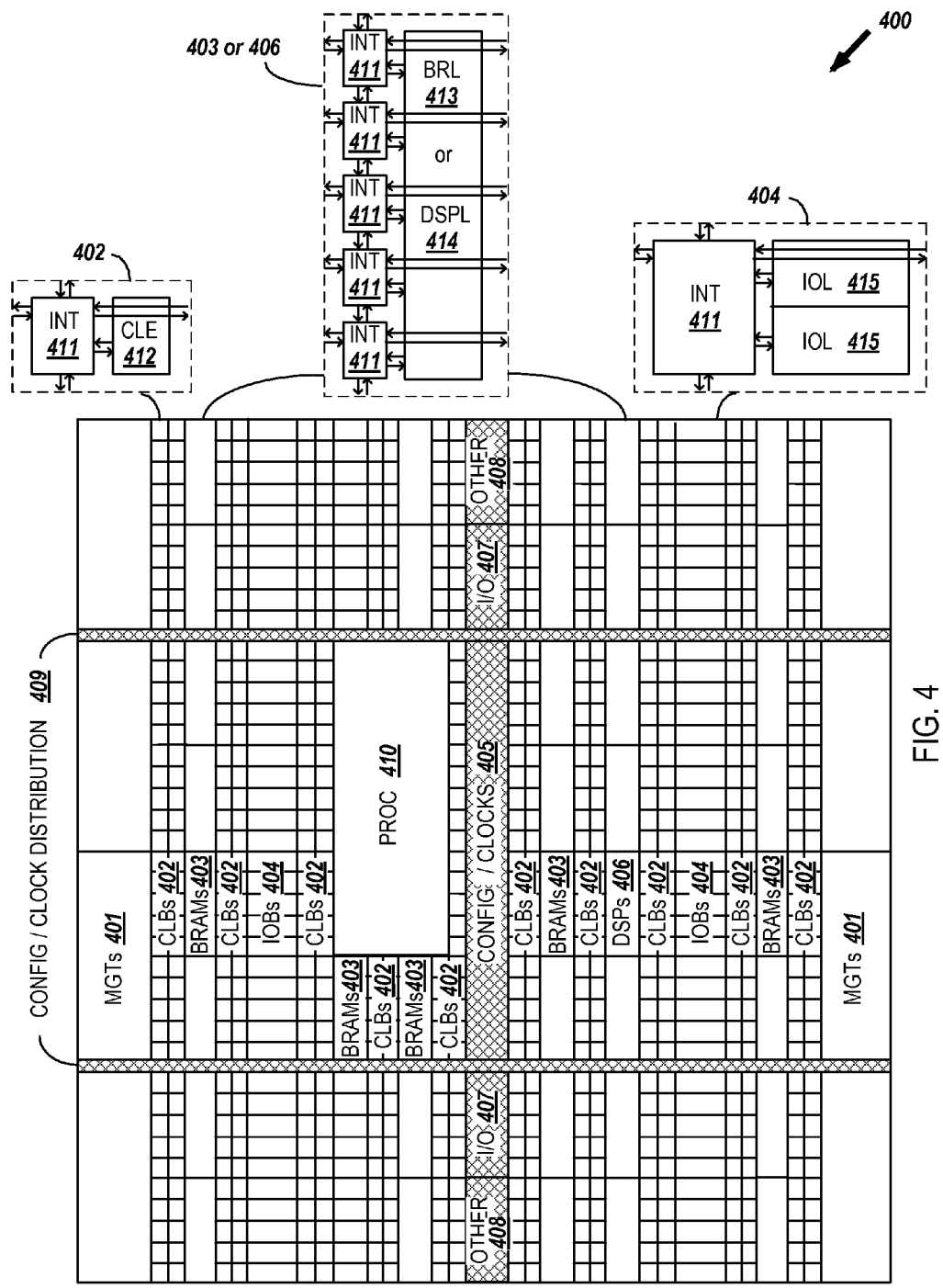
FIG. 4 shows a block diagram of an example programmable integrated circuit that may be used in implementing a Reed-Solomon encoder in accordance with one or more embodiments.

FIG. 4 is a block diagram of an example programmable logic integrated circuit that may be used in implementing a decoder for forward error correction in accordance with one or more embodiments. A decoder for forward error correction, as previously described, may be implemented on the programmable logic and interconnect resources of a programmable integrated circuit.

Programmable ICs can include several different types of programmable logic blocks in the array. For example, FIG. 4 illustrates a type of programmable IC known as a field programmable gate array (FPGA) (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407), for example, e.g., clock ports, and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

Figure 5:
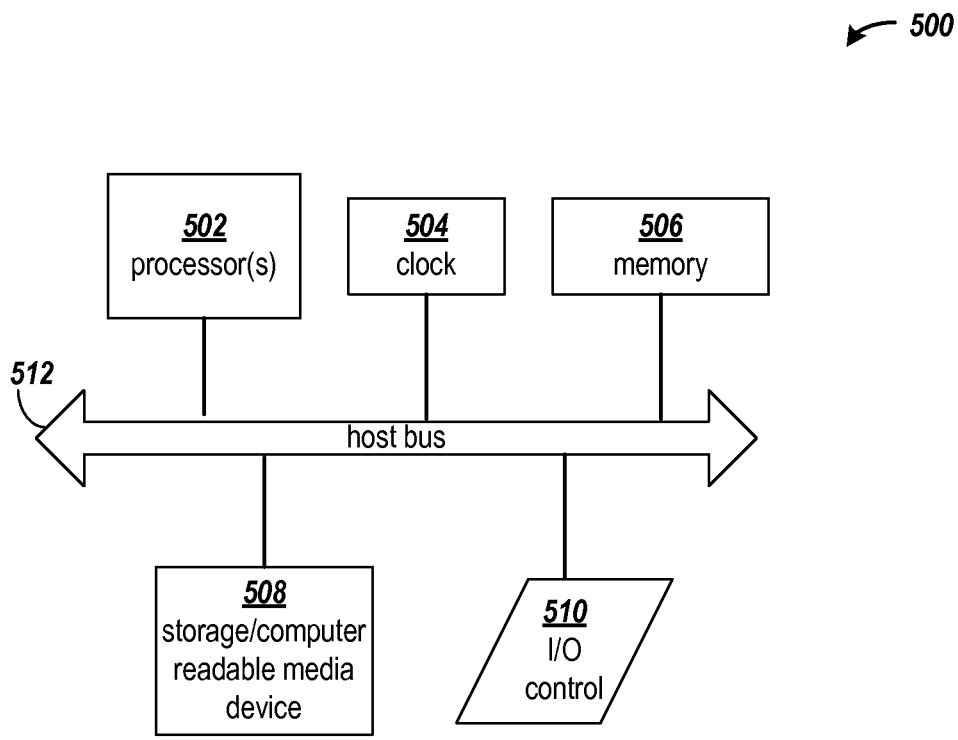
FIG. 5 shows a computing arrangement that may be configured to implement the processes and functions described herein.

FIG. 5 shows a block diagram of an example computing arrangement that may be configured to implement the processes and functions described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory unit 506, a storage unit 508, and an input/output control unit 510 coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

The embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. An encoder for encoding a sequence of symbols, comprising:
    an input circuit having a plurality of finite field subtraction circuits, each configured to receive a respective one of the sequence of symbols and subtract the one symbol from a respective symbol of an intermediate polynomial over a finite field to produce a respective feedback symbol;
    a first circuit configured and arranged to, for each coefficient of a code generation polynomial:
        multiply each of the feedback symbols over the finite field by a respective constant corresponding to the coefficient to produce a first set of intermediate results; and
        add the first set of intermediate results over the finite field to produce a second intermediate result; and
    a buffer circuit having inputs coupled to the first circuit and outputs coupled to inputs of the plurality of finite field subtraction circuits, the buffer circuit configured and arranged to store the second intermediate results produced by the first circuit as the intermediate polynomial.

2. The encoder of claim 1, wherein:
    the first circuit is further configured and arranged to, in response to the subsequent second intermediate results, to subtract the subsequent second intermediate results from the stored intermediate polynomial, resulting in an updated intermediate polynomial; and
    the finite field multiplication, addition and subtraction operations performed by the first circuit are implemented by XOR logic circuitry.

3. The encoder of claim 2, wherein the XOR logic circuitry is optimized for each respective constant.

4. The encoder of claim 1, wherein:
    the first circuit is further configured and arranged to, in response to the subsequent second intermediate results, to subtract the subsequent second intermediate results from the stored intermediate polynomial, resulting in an updated intermediate polynomial;
    the plurality of finite field subtraction circuits of the input circuit includes N finite field subtraction circuits; and
    the buffer circuit includes N pipelined buffer circuits, each having inputs coupled to the first circuit and an output coupled to a respective one of the N finite field subtraction circuits of the input circuit.

5. The encoder of claim 4, wherein the N finite field subtraction circuits of the input circuit are configured and arranged to subtract the respective one of the subset of symbols from the output of a respective one of the N pipelined buffer circuits.

6. The encoder of claim 4, wherein:
    the code generation polynomial includes M coefficients ($0 \leq i < M$) and M is evenly divisible by N; and
    each pipelined buffer circuit, X ($0 \leq X < N$), of the N pipelined buffer circuits includes:
        a plurality of shift registers, the plurality including a number of shift registers equal to M/N;
        a first one of the plurality of shift registers coupled to receive the second intermediate result corresponding to coefficient $C_x$ of the M coefficients; and
        for every $N^{th}$ coefficient following $C_x$, the first circuit is configured and arranged to subtract the second intermediate result corresponding to the $X+N^{th}$ coefficient from the intermediate polynomial buffered in the plurality of shift registers.

7. The encoder of claim 6, wherein each of the M/N shift registers is configured to buffer N intermediate results.

8. The encoder of claim 4, wherein:
    M is not evenly divisible by N;
    each pipelined buffer circuit, X (X<mod(M, N)), of the N pipelined buffer circuits includes a plurality of shift registers, the plurality including a number of shift registers equal to floor(M/N)+1; and
    each pipelined buffer circuit, X (X≥mod(M, N)), of the N pipelined buffer circuits includes a plurality of shift registers, the plurality including a number of shift registers equal to floor(M/N).

9. The encoder of claim 1, wherein:
    the code generation polynomial includes M coefficients ($0 \leq i < M$); and
    the plurality of finite field subtraction circuits of the input circuit includes M finite field subtraction circuits.

10. The encoder of claim 1, wherein:
    the sequence of symbols includes K symbols; and
    the encoder further includes an output selection circuit configured to output the K input symbols as the K input symbols are received, and following reception of the K input symbols, to output the symbols output from the buffer circuit.

11. A parallel encoding circuit, comprising:
    an input circuit having N finite field subtraction circuits, each configured and arranged to receive a respective symbol of a data block and subtract the respective symbol of the data block from a respective symbol of an intermediate polynomial to produce a respective feedback symbol;
    a circuit including, for each coefficient of a code generation polynomial having N coefficients:
        N finite field multipliers coupled to the input circuit, each configured to multiply a respective one of the feedback symbols by a respective constant corresponding to the coefficient; and
        a finite field adder coupled to the N finite field multipliers and configured and arranged to add the output of the N finite field multipliers to produce an intermediate result; and
    a plurality of shift registers, each having an input coupled to an output of a respective one of the finite field adders, and each having an output coupled to an input of a respective one of the N finite field subtraction circuits of the input circuit, the shift registers storing symbols of the intermediate polynomial.

12. The parallel encoding circuit of claim 11, wherein each of the plurality of shift registers is configured and arranged to buffer N symbols.

13. The parallel encoding circuit of claim 11, wherein:
    the finite field multiplication and addition performed by the circuit are implemented by XOR logic; and the XOR logic is optimized for each respective coefficient of the code generator polynomial.

14. A method of generating a hardware description language (HDL) circuit design specification of an encoder circuit, comprising:
inputting a code generation polynomial having M coefficients ($0 \leq i < M$), and inputting a parameter value for N ($2 <= N <= M$);
using a processor, generating, in response to the input code generation polynomial and the parameter value for N, an HDL circuit design specification of an encoder circuit for the code generation polynomial, the encoder circuit including:
an input circuit having N finite field subtraction circuits, each configured and arranged to receive a respective one of an input sequence of symbols and subtract the one symbol from a respective symbol of an intermediate polynomial over a finite field to produce a respective feedback symbol;
a first circuit configured and arranged to, for each coefficient of the M coefficients of the code generation polynomial:
multiply each of the feedback symbols over the finite field by a respective constant corresponding to the coefficient to produce a set of first intermediate results; and
add the set of first intermediate results over the finite field to produce a second intermediate result; and
a buffer circuit having inputs coupled to the first circuit and outputs coupled to inputs of the N finite field subtraction circuits, the buffer circuit configured and arranged to store the second intermediate results produced by the first circuit as the intermediate polynomial; and
storing the generated HDL circuit design specification in a non-transitory computer readable medium.

15. The method of claim 14, wherein the generating of the HDL circuit design specification of the encoder includes generating the HDL circuit design specification of the first circuit that is further configured and arranged to, in response to the subsequent second intermediate results, subtract the subsequent second intermediate results from the stored intermediate polynomial, resulting in an updated intermediate polynomial.

16. The method of claim 15, wherein the generating of the HDL circuit design specification of the encoder includes generating the HDL circuit design specification of the finite field multiplication, addition and subtraction operations in XOR logic circuitry.

17. The method of claim 16, further comprising, optimizing the XOR logic circuitry for each respective constant to reduce a number of XOR operations.

18. The method of claim 17, wherein the generating of the HDL circuit design specification of the encoder includes:
generating the HDL circuit design specification of the buffer circuit to include N pipelined buffer circuits, each having inputs coupled to the first circuit and an output coupled to a respective one of the N finite field subtraction circuits of the input circuit; and
generating the HDL circuit design specification of the finite field subtraction circuits of the input circuit to subtract the respective one of the input sequence of symbols from a respective one of the N buffer pipelines.

19. The encoder of claim 1, wherein the first circuit is configured and arranged to receive the respective feedback symbols from the plurality of finite field subtraction circuits, in parallel.

20. The encoder of claim 19, wherein the first circuit is further configured and arranged to concurrently multiply the feedback symbols by the corresponding respective constants.

* * * * *